(12) United States Patent
Tu et al.

(10) Patent No.: US 9,613,595 B2
(45) Date of Patent: *Apr. 4, 2017

(54) SHIFT REGISTER

(71) Applicant: AU Optronics Corp., Hsin-Chu (TW)

(72) Inventors: Chun-Da Tu, Hsin-Chu (TW);
Chih-Wei Tai, Hsin-Chu (TW);
Yung-Chih Chen, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/059,365

(22) Filed: Mar. 3, 2016

(65) Prior Publication Data

US 2016/0203876 A1     Jul. 14, 2016

Related U.S. Application Data

(63) Continuation of application No. 14/543,990, filed on Nov. 18, 2014, now Pat. No. 9,305,522.

(30) Foreign Application Priority Data

Aug. 29, 2014 (TW) .............................. 103129940 A

(51) Int. Cl.
*G09G 5/18*     (2006.01)
*G11C 19/00*     (2006.01)
(Continued)

(52) U.S. Cl.
CPC ................. *G09G 5/18* (2013.01); *G09G 3/20* (2013.01); *G11C 19/00* (2013.01); *G11C 19/28* (2013.01);
(Continued)

(58) Field of Classification Search
CPC ....... G11C 19/287; G11C 19/00; G11C 19/28; G09G 3/20; G09G 2310/0286; G09G 5/18

See application file for complete search history.

(56) References Cited

U.S. PATENT DOCUMENTS 6,724,361 B1    4/2004    Washio et al.
8,059,780 B2    11/2011    Wang et al.
(Continued)

FOREIGN PATENT DOCUMENTS

CN     103985343 A     8/2014
TW     201133440 A1     10/2011
TW     201248585 A1     12/2012

OTHER PUBLICATIONS

Office Action issued in corresponding China patent application on Mar. 28, 2016.
(Continued)

Primary Examiner — Fred Tzeng
(74) Attorney, Agent, or Firm — McClure, Qualey & Rodack, LLP

(57) ABSTRACT

A driving circuit comprises a plurality of shift register (SR). An $i^{th}$ SR among the plurality SR's comprises a resetting circuit, an input switch, a capacitor, and an output circuit. The resetting circuit is used for adjusting a resetting voltage according to a control voltage. The input switch is used for adjusting the control voltage according to an $(i-2)^{th}$ driving signal from an $(i-2)^{th}$ SR among the plurality of SR's, selectively. The capacitor is used for adding a voltage variation of a boosting signal to the control voltage. The output circuit is used for taking an $i^{th}$ input signal as an $i^{th}$ output signal according to the control voltage and the resetting voltage, selectively. The positive edge of the boosting voltage leads the negative edge of the $i^{th}$ input signal.

11 Claims, 4 Drawing Sheets

(51) Int. Cl.
    *G11C 19/28* (2006.01)
    *G09G 3/20* (2006.01)
(52) U.S. Cl.
    CPC . *G09G 2300/04* (2013.01); *G09G 2310/0286* (2013.01); *G09G 2310/0289* (2013.01); *G11C 19/287* (2013.01)

(56) References Cited

U.S. PATENT DOCUMENTS

| | | | |
|---|---|---|---|
| 9,208,737 | B2 | 12/2015 | Hong et al. |
| 2005/0201508 | A1 | 9/2005 | Shin et al. |
| 2006/0279511 | A1 | 12/2006 | Uh et al. |
| 2008/0253501 | A1 | 10/2008 | Gen-Chi |
| 2009/0303211 | A1 | 12/2009 | Hu |
| 2011/0134090 | A1 | 6/2011 | Iwamoto et al. |
| 2011/0310074 | A1 | 12/2011 | Ochiai et al. |
| 2012/0044133 | A1 | 2/2012 | Nakamizo et al. |
| 2012/0146978 | A1* | 6/2012 | Park ............... G11C 19/287 345/211 |
| 2012/0169703 | A1* | 7/2012 | Yang ............... G11C 19/184 345/212 |
| 2013/0169609 | A1* | 7/2013 | Son ............... G11C 19/28 345/209 |
| 2014/0064436 | A1 | 3/2014 | Ma |
| 2014/0111413 | A1 | 4/2014 | Chen et al. |
| 2014/0177348 | A1 | 6/2014 | Wang |
| 2014/0218274 | A1* | 8/2014 | Yamashita ........... G09G 3/3677 345/84 |
| 2014/0376682 | A1 | 12/2014 | Jang et al. |
| 2015/0009111 | A1* | 1/2015 | Yamauchi ............ G09G 3/3233 345/92 |
| 2016/0111950 | A1* | 4/2016 | Duncan .................... G05F 1/59 323/268 |

OTHER PUBLICATIONS

Office Action issued in corresponding Taiwan patent application on Dec. 17, 2015.

* cited by examiner

SHIFT REGISTER

CROSS-REFERENCE TO RELATED APPLICATIONS

This non-provisional application claims benefit under 35 U.S.C. §120(a) on U.S. patent application Ser. No. 14/543,990 filed in the U.S. on Nov. 18, 2014, which claims priority under 35 U.S.C. §119(a) on Patent Application No. 103129940 filed in Taiwan, R.O.C on Aug. 29, 2014, the entire contents of which are hereby incorporated by reference.

BACKGROUND OF THE INVENTION

Technical Field of the Invention

The present invention relates to a driving circuit, particularly to a driving circuit with high driving ability.

Description of the Related Art

The gate driver or source driver of a display device is usually consisting of a plurality of connected shift registers and other circuits. In recent years, because of the development of thin-film transistor (TFT) manufacturing process, the circuits of many display devices are manufactured directly on the substrage of the display devices. However, the circuits manufactured by the TFT manufacturing process are usually limited to all N-type TFTs or all P-type TFTs. Therefore, in the operation of certain circuits, the driving ability of the switch manufactured by the TFT manufacturing process is limited. The insufficient driving ability leads to longer propagation delay of the circuit of the shift registers, so that the frame rate of the display device is limited.

SUMMARY OF THE INVENTION

A driving circuit according to one or a plurality of embodiments of the present invention includes a plurality of shift registers (SRs), wherein an $i^{th}$ SR among the plurality of SRs includes a resetting circuit, an input switch, a capacitor, and an output circuit. The resetting circuit is for selectively adjusting a resetting voltage according to a control voltage. The input switch is electrically connected with an $(i-2)^{th}$ SR among the plurality of SRs, for selectively adjusting the control voltage according to an received $(i-2)^{th}$ driving signal outputted from an $(i-2)^{th}$ SR. The capacitor is electrically connected between a boosting signal and the input switch, for adding a voltage variation of the boosting signal to the control voltage. The output circuit is electrically connected with the input switch and the resetting circuit, for selectively outputting an $i^{th}$ input signal to an $i^{th}$ driving signal of the $i^{th}$ SR according to the control voltage and the resetting voltage. The positive edge of the boosting voltage leads the negative edge of the $i^{th}$ input signal.

The contents of the present invention set forth and the embodiments hereinafter are for demonstrating and illustrating the spirit and principles of the present invention, and for providing further explanation of the claims.

BRIEF DESCRIPTION OF THE DRAWINGS

The present invention will become more fully understood from the detailed description given hereinbelow and the accompanying drawings, which are given by way of illustration only and thus are not limitative of the present invention and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
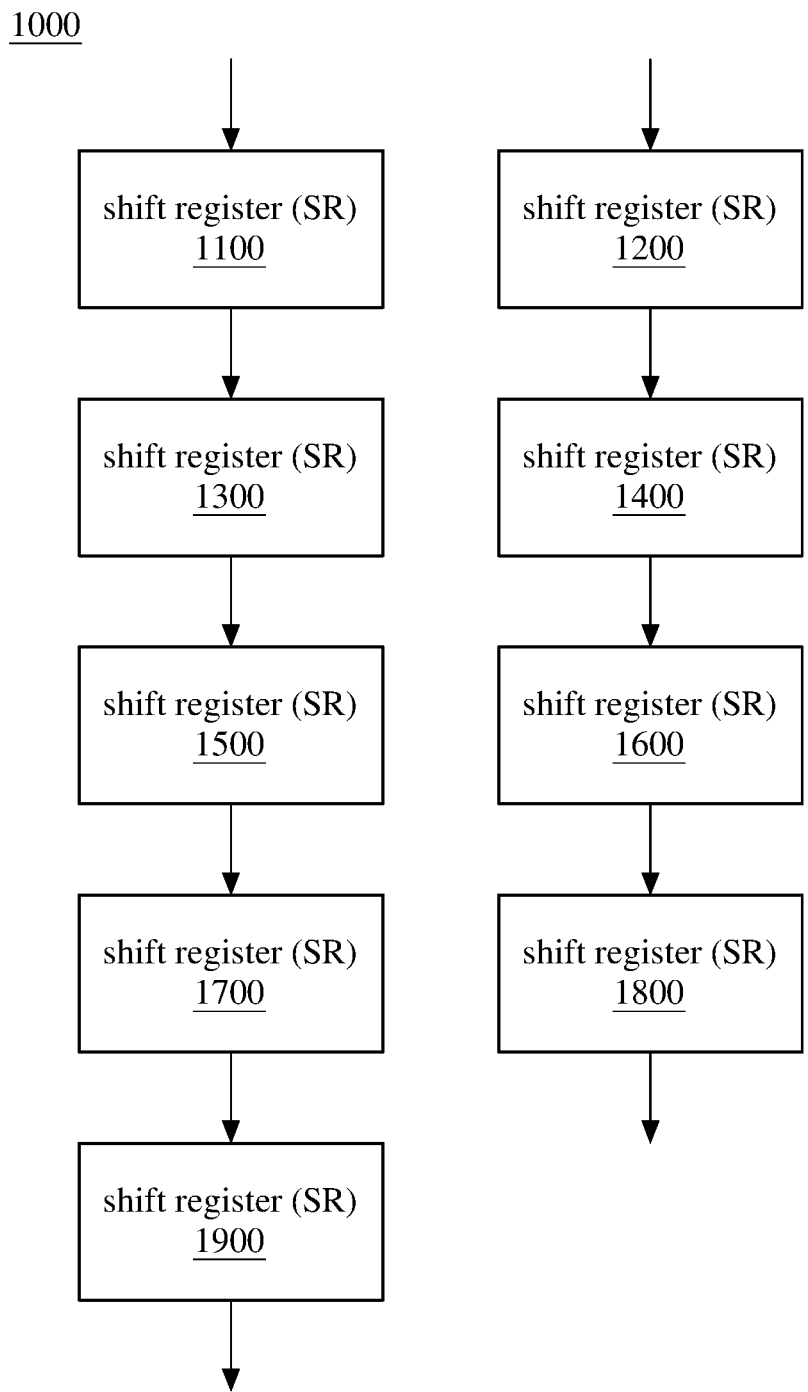
FIG. 1 is a diagram of a driving circuit according to an embodiment of the present invention.
Figure 2:
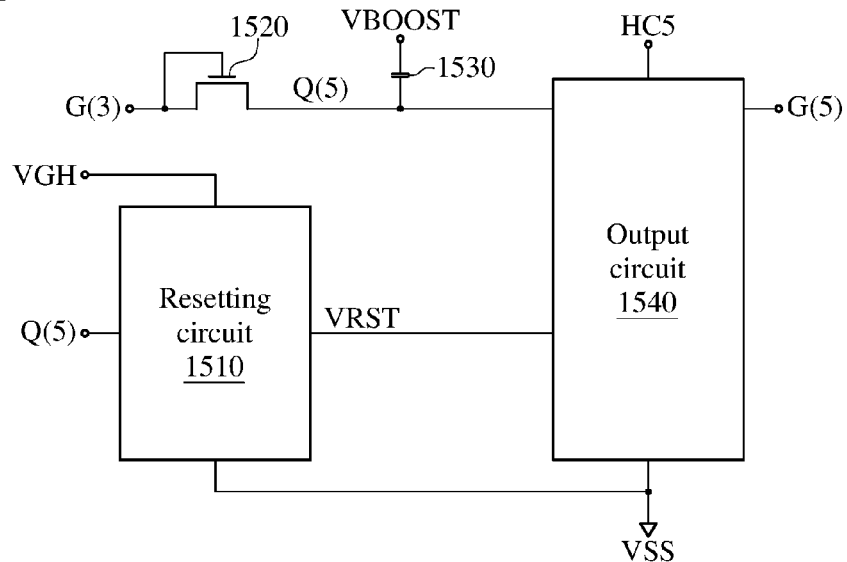
FIG. 2 is a diagram of a shift register (SR) circuit according to an embodiment of the present invention.

In association with a driving circuit of an embodiment of the present invention, please refer to FIG. 1. FIG. 1 is a diagram of a driving circuit according to an embodiment of the present invention. As shown in FIG. 1, the driving circuit 1000 includes a plurality of shift registers (SRs) 1100~1900, wherein the SR 1100 is the $1^{st}$ SR, the SR 1200 is the $2^{nd}$ SR, the SR 1900 is the $9^{th}$ SR, and so on. Taking the $5^{th}$ SR 1500 for example, please refer to FIG. 2. FIG. 2 is a diagram of a shift register (SR) circuit according to an embodiment of the present invention. As shown in FIG. 2, the SR 1500 includes a resetting circuit 1510, an input switch 1520, a capacitor 1530, and an output circuit 1540, wherein the input switch 1520 is electrically connected with the $3^{rd}$ SR 1300 among the plurality of SRs, and the capacitor 1530 is electrically connected between a boosting signal VBOOST and the input switch 1520, and the output circuit 1540 is electrically connected with the input switch 1520 and the resetting circuit 1510. In association with the interaction and actuation of each circuit component in the SR 1500, the details are further described below.

Figure 3:
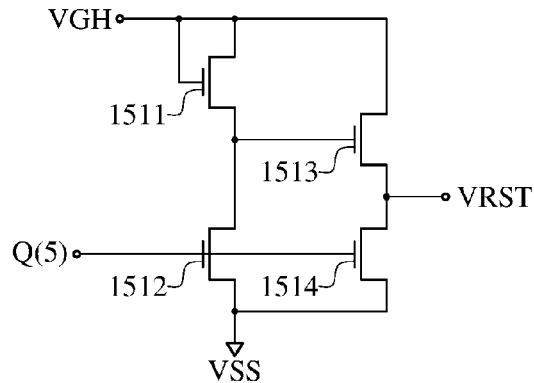
FIG. 3 is a diagram of a resetting circuit according to an embodiment of the present invention.

The resetting circuit 1510 is for selectively adjusting the resetting voltage VRST according to the control voltage Q(5). Please refer to FIG. 3. FIG. 3 is a diagram of a resetting circuit according to an embodiment of the present invention. As shown in FIG. 3, the resetting circuit 1510 includes a switch 1511, a switch 1512, a switch 1513 and a switch 1514, wherein the first terminal and the control terminal of the switch 1511 are electrically connected with the high voltage VGH. The first terminal of the switch 1512 is electrically connected with the second terminal of the switch 1511, and the control terminal of the switch 1512 is for receiving the control voltage Q(5), and the second terminal of the switch 1512 is electrically connected with the low voltage VSS. The first terminal of the switch 1513 is also electrically connected with the high voltage VGH, and the control terminal of the switch 1513 is electrically connected with the second terminal of the switch 1511. The first terminal of the switch 1514 is electrically connected with the second terminal of the switch 1513, and the control terminal of the switch 1514 is also for receiving the control voltage Q(5), and the second terminal of the switch 1514 is electrically connected with the low voltage VSS. The voltage of the conjunction of the second terminal of the switch 1513 and the first terminal of the switch 1514 is defined as the resetting voltage VRST. In the present embodiment, the switch 1511 to the switch 1514 is all illustrated with the N-type semiconductor.

When the electric potential of the control voltage Q(5) is at a low electric potential, the switch 1512 and the switch 1514 are not conducting thereby, so the electric potential of the second terminal of the switch 1511 is increased to the high voltage VGH minus the threshold voltage VTH1 of the switch 1511, and the electric potential of the second terminal of the switch 1511 is increased to the high voltage VGH minus the threshold voltage VTH1 of the switch 1511 and further minus the threshold voltage VTH3 of the switch 1513. On the contrary, when the electric potential of the control voltage Q(5) is at a high electric potential, the switch 1512 and the switch 1514 are conducting thereby, and the electric potential of the second terminal of the switch 1511 and the electric potential of the second terminal of the switch 1513 is pulled down to the low voltage VSS.

The input switch 1520 is for selectively adjusting the control voltage Q(5) by the received $3^{rd}$ driving signal G(3) outputted from the $3^{rd}$ SR 1300. Please refer back to FIG. 2. The first terminal and the control terminal of the input switch 1520 is electrically connected for receiving the $3^{rd}$ driving signal G(3), and the electric potential of the second terminal of the input switch 1520 is the control voltage Q(5) thereby. When the electric potential of the $3^{rd}$ driving signal G(3) is higher than the electric potential of the control voltage Q(5) plus the threshold voltage VTH0 of the input switch 1520, the input switch 1520 is conducting, so that eventually the electric potential of the control voltage Q(5) is pulled up to the electric potential of the $3^{rd}$ driving signal G(3) minus the threshold voltage VTH0 of the input switch 1520. On the contrary, when the electric potential of the $3^{rd}$ driving signal G(3) is lower than the electric potential of the control voltage Q(5) plus the threshold voltage VTH0 of the input switch 1520, the input switch 1520 is not conducting, and in this situation, the electric potential variation of the $3^{rd}$ driving signal G(3) does not affect the electric potential of the control voltage Q(5).

The capacitor 1530 is for adding the voltage variation of the boosting signal VBOOST to the control voltage Q(5). In the implementation, it is seen from FIG. 2 that the control voltage Q(5) and any other voltage source do not have a direct electric current path (such as a resistor, inductance, or wire). Therefore, when there is a step variation in the boosting signal VBOOST, the electric potential variation of the boosting signal VBOOST is reflected on the control voltage Q(5). For example, assuming that the original electric potential of the control voltage Q(5) is 2 volts and the electric potential of the boosting signal VBOOST is 0 volt, when the electric potential of the boosting signal VBOOST is quickly pulled up to 2 volts from 0 volt, the electric potential of the control voltage Q(5) is approximately pulled up to 4 volts or close to 4 volts. The capacitor 1530 is using the coupling effect to add the voltage variation of the boosting signal VBOOST to the control voltage Q(5).

Figure 4:
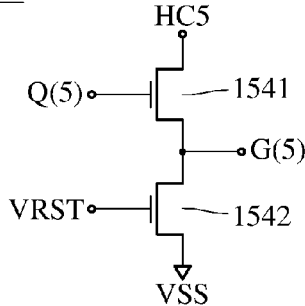
FIG. 4 is a diagram of an output circuit according to an embodiment of the present invention.

The output circuit 1540 is for selectively outputting the $5^{th}$ input signal HC5 to the $5^{th}$ driving signal G(5) of the $5^{th}$ SR 1500 according to the control voltage Q(5) and the resetting voltage VRST. Please refer to FIG. 4. FIG. 4 is a diagram of an output circuit according to an embodiment of the present invention. As shown in FIG. 4, the output circuit 1540 includes a first output switch 1541 and a second output switch 1542. The first output switch 1541 has a first terminal, a control terminal, and a second terminal. The first terminal of the first output switch 1541 is for receiving the $5^{th}$ input signal HC5. The control terminal of the first output switch 1541 is electrically connected with the second terminal of the input switch 1520 for receiving the control voltage Q(5). The electric potential of the second terminal of the first output switch 1541 is the $5^{th}$ driving signal G(5). Therefore, the first output switch 1541 is selectively conducting or not conducting to output the $5^{th}$ input signal HC5 to the $5^{th}$ driving signal G(5) according to the control voltage Q(5). The second output switch 1542 has a first terminal, a second terminal, and a control terminal. The first terminal of the second output switch 1542 is electrically connected with the first reference voltage. In the present embodiment, the first reference voltage is the low voltage VSS. The control terminal of the second output switch 1542 is electrically connected with the resetting circuit 1510 for receiving the resetting voltage VRST. The second terminal of the second output switch 1542 is electrically connected with the second terminal of the first output switch 1541. The second output switch 1542 is selectively conducting or not conducting to output the first reference voltage (low voltage VSS) to the $5^{th}$ driving signal G(5). In the present embodiment, the rising edge/positive edge of the boosting signal VBOOST leads the falling edge/negative edge of the $5^{th}$ input signalHC5.

Figure 5:
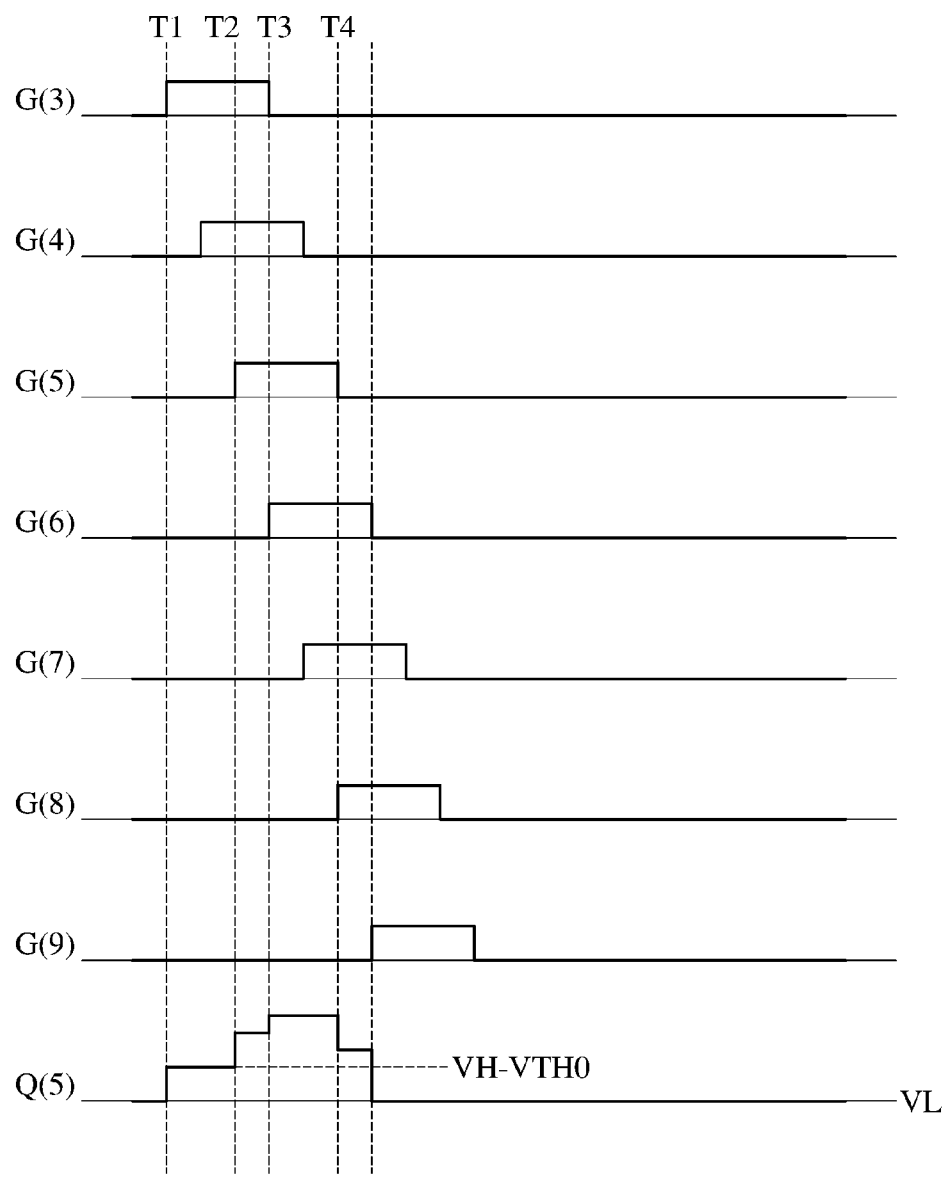
FIG. 5 is a timing diagram of each signal in the $5^{th}$ SR according to an embodiment of the present invention.

In an embodiment of the present invention, the boosting signal VBOOST is the $6^{th}$ driving signal G(6) outputted from the $6^{th}$ SR 1600 among the plurality of the SRs or the $6^{th}$ input signal HC6 received by the $6^{th}$ SR 1600. Taking the $6^{th}$ driving signal G(6) as the boosting signal VBOOST for example, please refer toe FIG. 5. FIG. 5 is a timing diagram of each signal in the $5^{th}$ SR according to an embodiment of the present invention. G(3) to G(9) respectively stands for the $3^{rd}$ driving signal to the $9^{th}$ driving signal. As shown in FIG. 5, in the first time point T1, the electric potential of the $3^{rd}$ driving signal G(3) is increased from the low voltage VL to the high voltage VH, and consequently the electric potential of the control voltage Q(5) is correspondingly pulled up from the low voltage VL to the high voltage VH minus the threshold voltage VTH0 of the input switch 1520. Therefore, starting from the first time T1, the first output switch 1541 of the $5^{th}$ SR 1500 is conducted. Next, in the second time T2, the electric potential of the $5^{th}$ input signal HC5 is pulled up to the high voltage VH from the low voltage VL, and the electric potential of the $5^{th}$ driving signal G(5) is increased accordingly. Meanwhile, because of the parasitic capacitor between the control terminal and the second terminal of the first output switch 1541, the electric potential of the control voltage Q(5) is further pulled up, so that the conduction rate of the first output switch 1541 is increased, and the electric potential of the $5^{th}$ driving signal G(5) is tolerated to be pulled up to the high voltage VH equivalently. Then, in the third time T3, because the electric potential of the $6^{th}$ driving signal G(6) is pulled up to the high voltage VH from the low voltage VL, the electric potential of the control voltage Q(5) is pulled up again. In the fourth time T4, because the electric potential of the $5^{th}$ input signal is changed to the low voltage VL from the high voltage VH, the electric potential of the control voltage Q(5) is correspondingly pulled down. However, because previously the capacitor 1530 coupled (added) the electric potential variation of the $6^{th}$ driving signal G(6) to the control voltage Q(5), the electric potential of the control voltage Q(5) starting from the fourth time T4 is slightly higher than the electric potential of the control voltage Q(5) between the first time T1 and the second time T2. Therefore, the time costs of pulling down the $5^{th}$ driving signal G(5) is reduced. In an embodiment of the present invention, a capacitor is additionally disposed between the control terminal and the second terminal of the first output switch 1541 to enhance the performance the parasitic capacitor between the control terminal and the second terminal of the first output switch 1541.

According to the said relationships between each signal, it is known that the larger the capacitor value of the capacitor 1530 comes with the larger pulled-up amplitude of the electric potential of the control voltage Q(5) in the third time T3. Therefore, assuming that the W/L ratio of the channel of the first output switch 1541 is fixed, the larger capacitor value of the capacitor 1530 comes with higher conduction rate (or driving ability) of the first output switch 1541. In other words, when the capacitor value of the capacitor 1530 is larger, the W/L ratio of the channel of the first output switch 1541 is moderately reduced without affecting the conduction rate (or driving ability) of the first output switch 1541.

In another embodiment of the present invention, the boosting signal VBOOST is also the $7^{th}$ driving signal G(7) outputted from the $7^{th}$ SR 1700 among the said plurality of SRs or the $7^{th}$ input signal HC7 received by the $7^{th}$ SR 1700. The actuation principle is almost the same as the previous embodiment and is not further described here.

Figure 6:
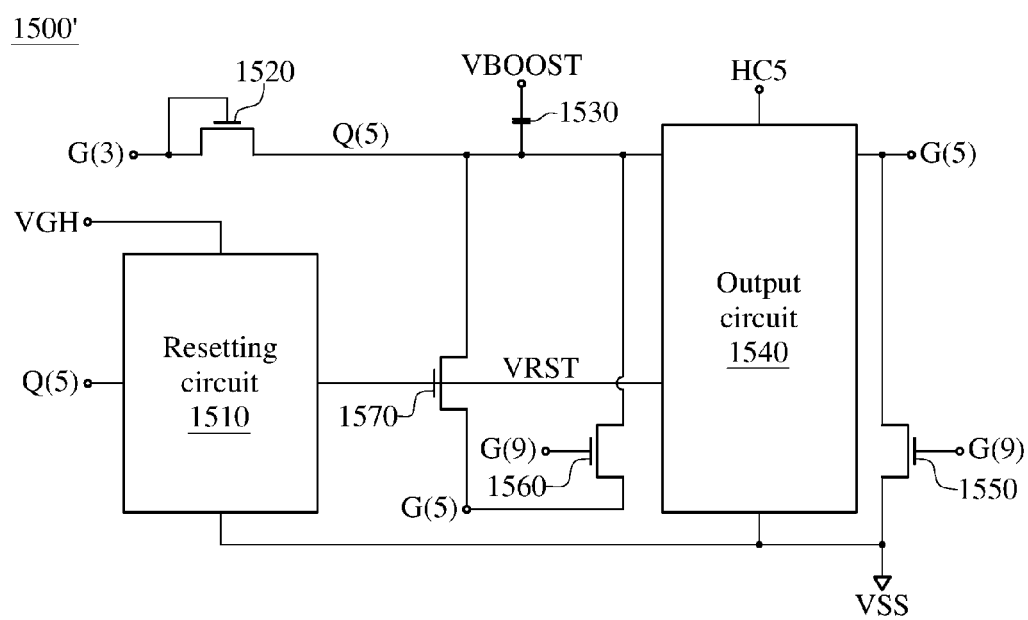
FIG. 6 is a diagram of a SR according to a further embodiment of the present invention.

Taking the $5^{th}$ SR for example, please refer to FIG. 6. FIG. 6 is a diagram of a SR according to a further embodiment of the present invention. As shown in FIG. 6, the $5^{th}$ SR 1500' compared to the $5^{th}$ SR 1500 in FIG. 2 further includes a first resetting switch 1550 and a second resetting switch 1560. The first terminal of the first resetting switch 1550 is electrically connected with the low voltage VSS and the second terminal thereof is electrically connected with the second terminal of the first output switch 1541, and the control terminal thereof is for receiving the $9^{th}$ driving signal G(9) outputted from the $9^{th}$ SR 1900. Therefore, when the electric potential of the control voltage Q(5) is at low voltage and the electric potential of the $9^{th}$ driving signal G(9) is at high voltage, the $5^{th}$ driving signal G(5) is pulled down to the low voltage VSS (the first reference voltage). In other words, the first resetting switch 1550 is controlled by the $9^{th}$ driving signal G(9) to pull down the voltage level of the $5^{th}$ driving signal G(5) to the first reference voltage.

The first terminal of the second resetting switch 1560 is electrically connected with the $5^{th}$ driving signal G(5), and the second terminal thereof is electrically connected with the control voltage Q(5), and the control terminal thereof is for receiving the $9^{th}$ driving signal G(9). Therefore, when the electric potential of the $9^{th}$ driving signal G(9) is at high voltage, the electric potential of the control signal Q(5) is adjusted to the electric potential of the $5^{th}$ driving signal G(5) equivalently. In other words, the second resetting switch 1560 is controlled by the $9^{th}$ driving signal G(9) to adjust the voltage level of the control voltage Q(5) to the voltage level of the $5^{th}$ driving signal G(5). Namely, the $5^{th}$ SR 1500 further resets the $5^{th}$ driving signal G(5) according to the $9^{th}$ driving signal G(9) outputted from the $9^{th}$ SR 1900.

Similarly, as shown in FIG. 6, the $5^{th}$ SR 1500' compared to the $5^{th}$ SR 1500 in FIG. 2 further includes a third resetting switch 1570. The first terminal of the third resetting switch 1570 is electrically connected with the $5^{th}$ driving signal G(5), and the second terminal is electrically connected with the second terminal of the input switch 1520, and the control terminal is electrically connected with the resetting circuit 1510. Therefore, the resetting circuit 1510 is controlled by the resetting voltage VRST and selectively adjust the voltage level of the control voltage Q(5) to the voltage level of the $5^{th}$ driving signal G(5).

In the SRs of the driving circuit disclosed by one or a plurality of embodiments of the present invention, by the capacitor 1530, the electric potential variation of the boosting signal VBOOST is added/coupled to the control voltage, so that the switch in output stage of the SR has higher conduction rate/driving ability. Therefore, the signal propagation delay of the SRs is reduced and the display device applying the driving circuit provides higher frame rate.

The foregoing description has been presented for purposes of illustration. It is not exhaustive and does not limit the invention to the precise forms or embodiments disclosed. Modifications and adaptations will be apparent to those skilled in the art from consideration of the specification and practice of the disclosed embodiments of the invention. It is intended, therefore, that the specification and examples be considered as exemplary only, with a true scope and spirit of the invention being indicated by the following claims and their full scope of equivalents.

What is claimed is:

1. A shift register, comprising:
   a resetting circuit for selectively adjusting a resetting voltage according to a control voltage;
   an input switch for selectively adjusting the control voltage according to a received signal outputted;
   a capacitor electrically connected to the input switch, coupling a boosting signal to the control voltage; and
   an output circuit electrically connected with the input switch and the resetting circuit, for selectively adjusting a voltage of a driving signal to a voltage of an input signal according to the control voltage and the resetting voltage;
   wherein the boosting voltage varies from a first state to a second state before the input signal varies from the second state to the first state and after the control voltage is adjusted according to the received signal.

2. The shift register of claim 1, wherein the boosting signal is a driving signal outputted from another shift register.

3. The shift register of claim 2, wherein the boosting signal is the driving signal outputted from a subsequent shift register.

4. The shift register of claim 1, wherein the boosting signal is an input signal of another shift register.

5. The shift register of claim 4, wherein the boosting signal is the input signal of a subsequent shift register.

6. The shift register of claim 1, wherein the driving signal is reset further according to a driving signal outputted from a subsequent shift register.

7. The shift register of claim 6, further comprising:
   a first resetting switch controlled by the driving signal of the subsequent shift register to pull down the voltage level of the driving signal of the shift register to a first reference voltage; and
   a second resetting switch controlled by the driving signal of the subsequent shift register to adjust the voltage level of the control voltage to the voltage level of the driving signal of the shift register.

8. The shift register of claim 6, further comprising:
   a third resetting switch controlled by the resetting voltage to adjust the voltage level of the control voltage to the voltage level of the driving signal of the shift register.

9. The shift register of claim 7, further comprising:
   a third resetting switch controlled by the resetting voltage to adjust the voltage level of the control voltage to the voltage level of the driving signal of the shift register.

10. The shift register of claim 1, wherein the output circuit comprises:
    a first output switch, comprising:
    a first terminal for receiving the input signal;

a control terminal electrically connected with the second terminal of the input switch; and
a second terminal for selectively outputting the input signal to the driving signal; and
a second output switch, comprising:
a first terminal electrically connected with a first reference voltage;
a control terminal electrically connected with the resetting circuit, for receiving the resetting voltage; and
a second terminal electrically connected with the second terminal of the first output switch, for selectively outputting the first reference voltage to the driving signal.

11. The shift register of claim 10, wherein the capacitor value of the capacitor and the W/L ratio of the channel of the first output switch has a negative correlation.

* * * * *